US012627302B2

(12) United States Patent
Zhang et al.

(10) Patent No.: US 12,627,302 B2
(45) Date of Patent: May 12, 2026

(54) DELAY LINE TEMPERATURE CALIBRATION

(71) Applicant: Apple Inc., Cupertino, CA (US)

(72) Inventors: Yudong Zhang, San Diego, CA (US);
Hanan Cohen, San Diego, CA (US);
Jacob S. Schneider, San Diego, CA
(US); Sanjeev K. Maheshwari,
Fremont, CA (US)

(73) Assignee: Apple Inc., Cupertino, CA (US)

( * ) Notice: Subject to any disclaimer, the term of this
patent is extended or adjusted under 35
U.S.C. 154(b) by 32 days.

(21) Appl. No.: 18/656,442

(22) Filed: May 6, 2024

(65) Prior Publication Data

US 2025/0343551 A1      Nov. 6, 2025

(51) Int. Cl.
H03L 7/081          (2006.01)
H03K 5/00          (2006.01)
H03K 5/14          (2014.01)
H03L 1/02          (2006.01)

(52) U.S. Cl.
CPC .............. H03L 7/081 (2013.01); H03K 5/14
(2013.01); H03K 2005/00019 (2013.01); H03L
1/02 (2013.01)

(58) Field of Classification Search
CPC .......... H03K 5/131; H03K 5/13; H03K 5/133;
H03K 7/08; H03K 19/0175; H03K 19/00;

H03K 19/018585; H03K 19/0185; H03L
7/0816; H03L 7/0812; H03L 7/081; H03L
7/0814; H03L 7/00; H03L 7/08; H03L
7/06
See application file for complete search history.

(56) References Cited

U.S. PATENT DOCUMENTS

| | | |
|---|---|---|
| 2019/0089360 A1 | 3/2019 | Roham |
| 2019/0187744 A1 | 6/2019 | Chang et al. |
| 2020/0343882 A1 | 10/2020 | van der Wagt et al. |
| 2022/0200606 A1 | 6/2022 | Tajalli et al. |
| 2023/0223943 A1 | 7/2023 | Abdulaziz et al. |
| 2023/0308103 A1 | 9/2023 | Han et al. |
| 2024/0106439 A1* | 3/2024 | Li ........................ H03L 7/0814 |

FOREIGN PATENT DOCUMENTS

| | | |
|---|---|---|
| CN | 107342766 B | 8/2023 |
| CN | 113014233 B | 1/2024 |
| KR | 2123270 B1 | 6/2020 |
| KR | 2024030636 A | 3/2024 |

* cited by examiner

*Primary Examiner* — Diana J. Cheng
(74) *Attorney, Agent, or Firm* — DICKINSON WRIGHT
RLLP

(57)          ABSTRACT

A delay-line circuit includes multiple variable-delay circuits
and may generate an output signal that is a delayed version
of an input signal. A calibration circuit includes an oscillator
circuit that may generate an oscillator signal, and may
include a replica of at least one of the multiple variable-
delay circuits. The calibration circuit may perform an initial
calibration of the delay-line circuit and, in response to a
completion of the initial calibration, perform a background
calibration of the delay-line circuit using the oscillator
signal.

20 Claims, 14 Drawing Sheets

Oscillator Circuit
109

Oscillator
Signal
404

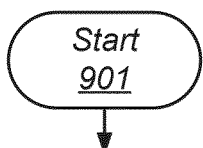

*Start*
*901*

Performing, by a calibration circuit that includes an oscillator circuit, an initial calibration of at least one delay line circuit that includes a plurality of variable-delay circuits, wherein the oscillator circuit includes a replica of at least one variable-delay circuit of the plurality of variable-delay circuits, and wherein the oscillator circuit is configured to generate at least one oscillator signal
902

Performing, by the calibration circuit in response to completing the initial calibration, a background calibration of the at least one delay line circuit using the at least one oscillator signal
903

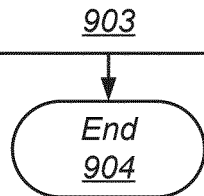

*End*
*904*

*FIG. 9*

DELAY LINE TEMPERATURE CALIBRATION

FIELD

The described embodiments relate generally to computer systems and, more particularly, to techniques for calibrating delay-line circuits used in the creation of delayed versions of signals.

BACKGROUND

Modern computer systems may include multiple circuit blocks designed to perform various functions. For example, such circuit blocks may include processors or processor cores configured to execute software or program instructions. Additionally, the circuit blocks may include memory circuits, mixed-signal circuits, analog circuits, and the like.

Some computer systems include circuit blocks that include digital circuits that operate using a period digital signal referred to as a "clock signal." Various circuits may be used to generate clock signals in a computer system. For example, in some computer systems, a crystal oscillator circuit or an inductor-capacitor oscillator circuit (referred to as an "LC oscillator circuit") may be used to generate a clock signal that has a particular frequency. Clocks signals of other frequencies can be generated using phase-locked loop circuits or delay-locked loop circuits.

BRIEF DESCRIPTION OF THE DRAWINGS

FIG. 9 is a flow diagram depicting an embodiment of a method for calibrating a delay-line circuit.

DETAILED DESCRIPTION

Figure 1:
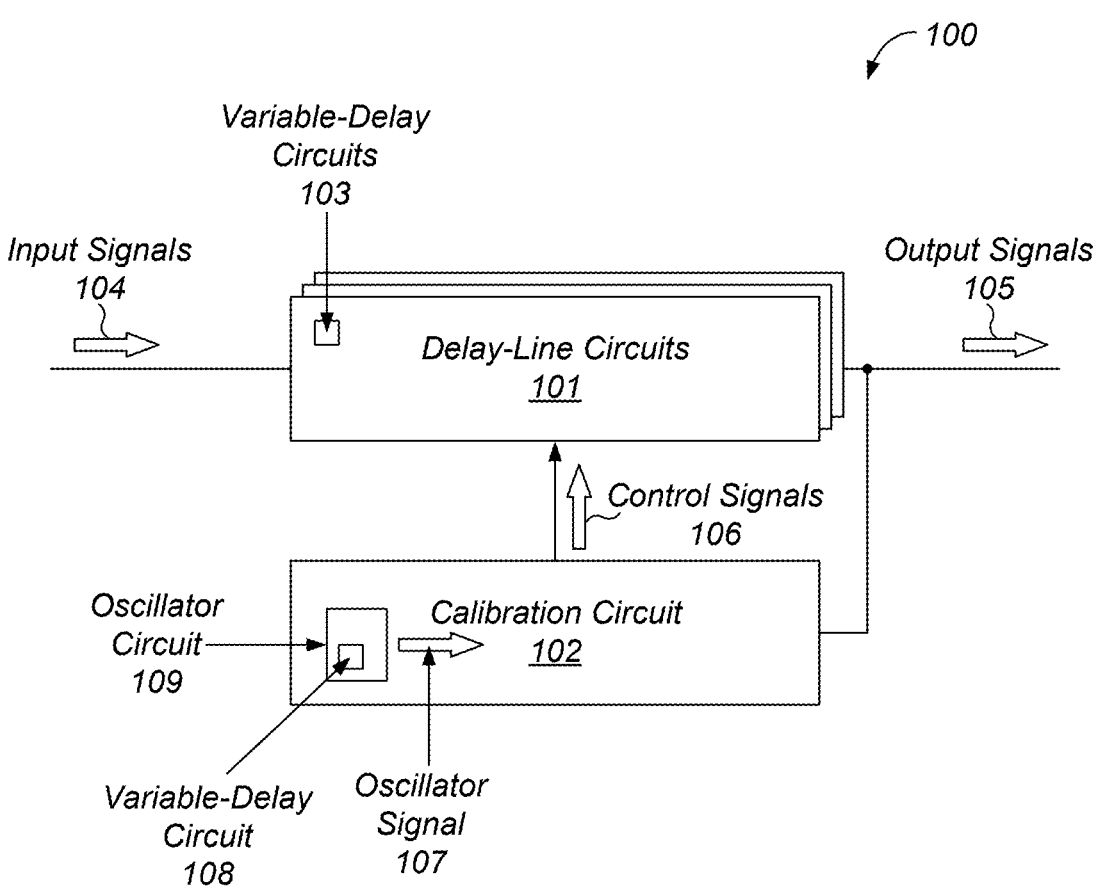
FIG. 1 is a block diagram depicting an embodiment of a delay-line subsystem.

Computer systems may include multiple circuit blocks configured to use periodic signals, referred to as clock signals, to perform various operations. For example, in some computer systems, one or more clock signals may be used to send data from one device to another within the computer system. In such cases, the one or more clock signals may be transmitted along with the data, and the receiving device may use the one or more clock signals to sample the received data.

A variety of techniques may be employed to generate the various clock signals a computer system may employ. In some cases, a crystal oscillator circuit or LC oscillator circuit may be used to generate a base clock signal that can be used to generate other clock signals of various frequencies. In some computer systems, phase-locked loop circuits or delay-locked loop circuits may be employed to generate the desired clock signals.

Another technique for generating clock signals involves the use of a digitally controlled delay line ("DCDL") circuit that generates different clocks signals with the same frequency but different phases by delaying an input clock signal by different time periods. For example, a DCDL circuit may be used to generate quadrature clock signals where the phase difference between each of the quadrature clock signals is 90-degrees. In some computer systems, quadrature clocks can be transmitted along with data from one device to another within the computer system. The receiving device can include a phase interpolator circuit that uses the phase difference between the quadrature clocks to determine when to sample the received data.

Many DCDL circuits include both a fixed-delay path and a variable-delay path that generate respective clock signals by delaying an input clock signal. The delay of the variable-delay path can be adjusted to compensate for changes in the operating conditions of a computer system. For example, a change in temperature or power supply voltage can affect the delay of both the fixed-delay path and the variable-delay path. Control circuits can adjust the delay of the variable-delay path to maintain the desired phase difference between the generated clock signals.

In some computer systems, variable-delay circuits included in DCDL circuits are adjusted over time to compensate for temperature-induced drift in the frequency of output signals generated by the DCDL circuits. To determine corrections for the variable-delay circuits, one or more of the output signals generated by the DCDL circuits are compared to a reference clock signal. Such reference clock signals may not be active during sleep modes, which can result in drift in the frequencies of the signals generated by a DCDL circuit upon recovery from a sleep mode. During the time required to adjust the variable-delay circuits in the DCDL circuit, jitter resulting from the drift of the DCDL circuit can result in incorrect data sampling on a communication bus, setup and/or hold time failures, and the like.

The embodiments illustrated in the drawings and described below provide techniques for calibrating a delay-line circuit without a reference clock signal. After an initial calibration, an oscillator that uses a similar delay-path topology as the delay-line circuit is used to generate oscillator signals that track the variation in temperature as an output signal of the delay-line circuit. By periodically monitoring the oscillator signals, control codes to variable-delay circuits included in the delay-line circuit can be adjusted to remediate temperature-induced drift in the output signal of the delay-line circuit.

A block diagram of a delay-line subsystem is depicted in FIG. 1. As illustrated, delay-line subsystem 100 includes delay-line circuits 101 and calibration circuit 102. Delay-line circuits 101 includes variable-delay circuits 103, while calibration circuit 102 includes oscillator circuit 109. It is noted that a given delay-line circuit of delay-line circuits 101 can include any suitable number of variable-delay circuits as well as any suitable number of fixed-delay circuits. Although three delay-line circuits are depicted in the embodiment of FIG. 1, in other embodiments, any suitable number of delay-line circuits may be employed. In some cases, the number of delay-line circuits included in a delay-line subsystem may correspond to a number of lanes in a communication channel between two devices in a computer system.

Delay-line circuits 101 are configured to generate corresponding ones of output signals 105 using corresponding ones of input signals 104. In various embodiments, a given one of output signals 105 is a delayed version of a corresponding one of input signals 104. Delay-line circuits 101 are further configured to adjust an amount of delay from corresponding edges of input signals 104 to output signals 105 based on control signals 106. In various embodiments, different ones of delay-line circuits 101 can delay respective ones of input signals 104 by different amounts to generate output signals 105.

In various embodiments, input signal 104 may include multiple phases of a clock signal that can be employed to implement a particular communication protocol for transmitting and/or receiving data from one device to another in a computer system. In such cases, delay-line circuits 101 may be further configured to generate multiple output signals using a multiple phases of the clock signals. The multiple output signals may, in some embodiments, correspond to different phases of a clock signal, e.g., quadrature clock signals.

Calibration circuit 102 is configured to perform an initial calibration of delay-line circuits 101. In some embodiments, calibration circuit 102 may be additionally configured to determine values of control signals 106 during the initial calibration operation. During the initial calibration operation, calibration circuit 102 may be configured to determine an delay-line control code using one of output signals 105. The delay-line control code may, in some embodiments, be applied to all of delay-line circuits 101.

In various embodiments, calibration circuit 102 may be configured to perform initial calibration as part of a power-up routine for a computer system that includes delay-line subsystem 100. Alternatively or additionally, calibration circuit 102 may be configured to perform the initial calibration of delay-line in response to a reset of the computer system.

Calibration circuit 102 is further configured to perform, in response to a determination that the initial calibration has completed, a background calibration of the delay-line circuits 101 using oscillator signal 105. In various embodiments, calibration circuit 102 may be further configured to update control signals 106 when performing the background calibration. To update control signals 106, calibration circuit 102 may be further configured to generate an offset code which can be combined with delay-line control code generated during the initial calibration.

In some embodiments, input signals 104 may be deactivated for periods of time. For example, in some communication applications, input signals 104 may correspond to clock signals for different communication lane. During periods when the communication lanes are not being used, input signals 104 may be deactivated to reduce power consumption. While input signals 104 are inactive, variation in temperature and other environmental parameters, may affect delay-line circuits 101, and when operation resumes, respective delay values for delay-line circuits 101 may have shifted.

By employing oscillator signal 107, calibration circuit 102 can perform periodic background calibration operations for delay-line circuits 101 during periods when input signals 104 are inactive. Since delay-line circuits 101 can be calibrated during periods when input signals 104 are inactive, when input signals 104 resume activity, output signals 105 have the desired phase relationships.

In some embodiments, calibration circuit 102 may be configured to perform the background calibration at regular or periodic intervals. In such cases, the periodicity of the intervals may be programmable based on user supplied input, operation conditions, e.g., power supply voltage levels, temperature, and the like, of delay-line subsystem 100, or any other suitable criteria.

Oscillator circuit 109 is configured to generate oscillator signal 107 and may be implemented using at least one ring-oscillator circuit. Although oscillator circuit is depicted as generating a single oscillator signal, in other embodiments, oscillator circuit 109 may be configured to generate multiple oscillator signals with different phases and/or frequencies. Oscillator circuit 109 includes variable-delay circuit 108 which may, in various embodiments, be a replica of a given one of variable-delay circuits 103. As used herein, a first circuit is said to be a replica of a second circuit when the first circuit employs similar design (circuit topology, mask design, etc.) and manufacturing so as to minimize differences in electrical and performance characteristics between the first and second circuits.

Figure 2:
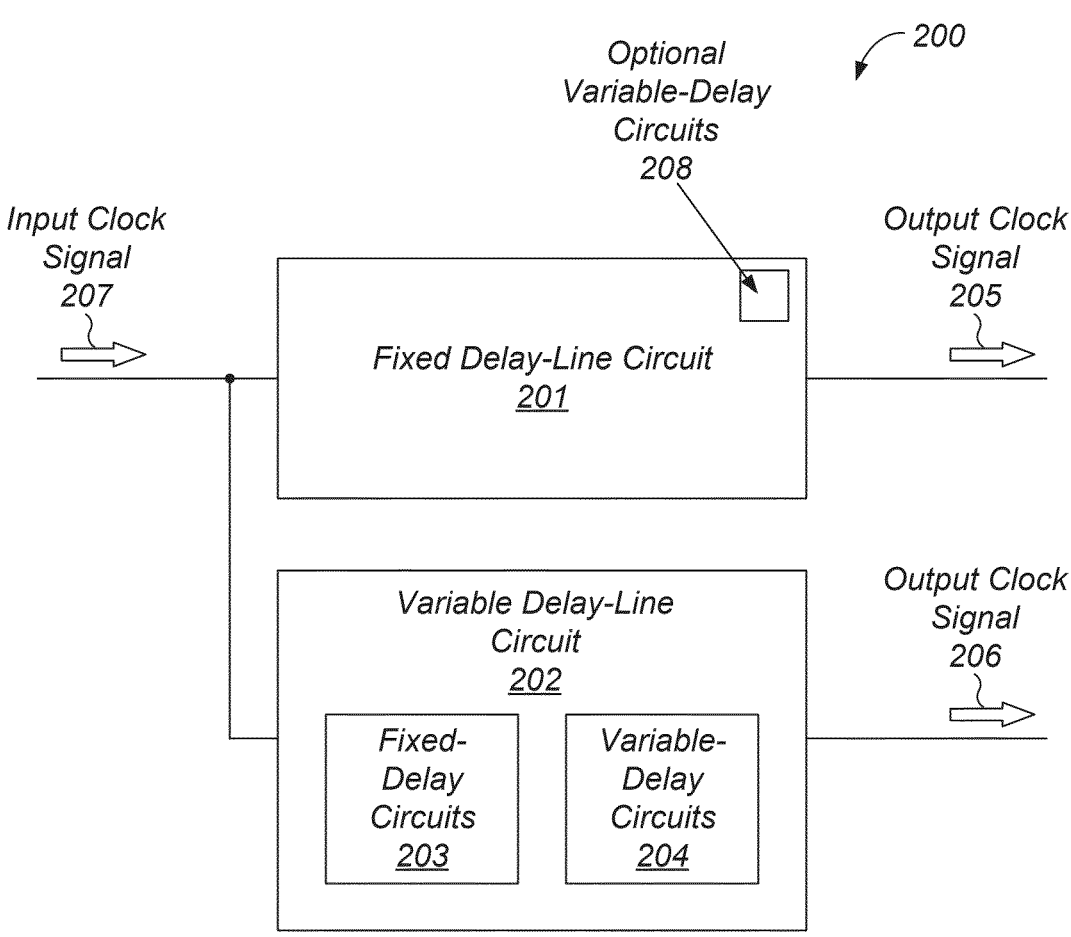
FIG. 2 is a block diagram depicting an embodiment of a delay-line circuit.

Turning to FIG. 2, a block diagram of an embodiment of a delay-line circuit is depicted. As illustrated, delay-line circuit 200 includes fixed delay-line circuit 201 and variable delay-line circuit 202. In various embodiments, delay-line circuit 200 may correspond to any of delay-line circuits 101 as depicted in FIG. 1. Although delay-line circuit 200 is depicted as having a single fixed-delay line circuit and a single variable delay-line circuit, in other embodiments, delay-line circuit 200 can include any suitable number of fixed and variable delay-line circuits.

Fixed delay-line circuit 201 is configured, in response to a given transition on input clock signal 207, to generate a corresponding transition on output clock signal 205 after a particular delay period has elapsed. In various embodiments, the particular delay period may be based on a number of gate delays included in fixed delay-line circuit 201. In some embodiments, a value for the particular delay period may be based on a communication standard for the transmission of data between two devices included in a computer system.

In some applications, the delay between input clock signal 207 and output clock signal 205 is equally important to the delay between input clock signal 207 and output clock signal 206. In such cases, fixed delay-line circuit 201 may optionally include variable-delay circuits 208 to increase the tuning range of fixed delay-line circuit 201. In cases when the delay between input clock signal 207 and output clock signal 205 is more important than the delay between input clock signal 207 and output clock signal 206, variable-delay circuits 208 may be omitted.

Variable delay-line circuit 202 includes fixed-delay circuits 203 and variable-delay circuits 204. In various embodiments, variable delay-line circuit 202 is configured to select, based on a frequency of input clock signal 207, a particular subset of fixed-delay circuits 203 and variable-delay circuits 204. Variable delay-line circuit 202 is further configured, in response to the particular subset receiving the given transition of input clock signal 207, to generate a corresponding transition on output clock signal 206 after a different delay period has elapsed. In various embodiments, the different delay period is greater than the particular delay period.

As described below, respective amounts of delay generated by variable-delay circuits 204 may be adjusted based on one or more operating conditions of a computer system that includes delay-line circuits 101. For example, in some cases, the delay generated by one or more of variable-delay circuits 204 may be adjusted based on a voltage level of a power supply node coupled to delay-line circuits 101 or the temperature of delay-line circuits 101. Additionally, or alternatively, the delay generated by one or more of variable-delay circuits 204 may be adjusted based on electrical properties of the transistors, e.g., threshold voltage values, resulting from the manufacture of delay-line circuits 101.

Figure 3:
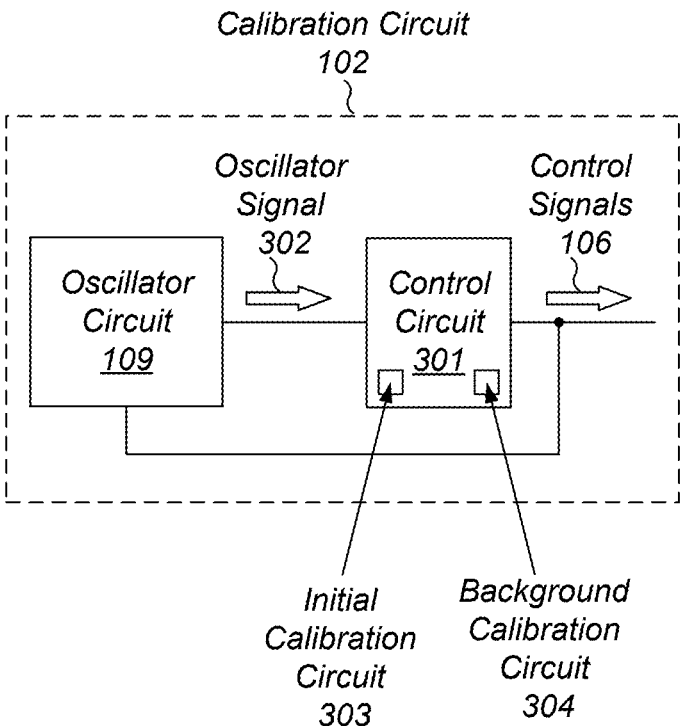
FIG. 3 is a block diagram depicting an embodiment of a calibration circuit for a delay-line circuit.

Turning to FIG. 3, a block diagram of calibration circuit 102 is depicted. As illustrated, calibration circuit 102 includes oscillator circuit 109 and control circuit 301.

Oscillator circuit 109 is configured to generate oscillator signal 302. In various embodiments, oscillator signal 302 may correspond to oscillator signal 107. Although oscillator circuit 109 is depicted as generating a single oscillator signal, in other embodiments, oscillator circuit 109 may be configured to generate any suitable number of oscillator signals. For example, in some embodiments, oscillator circuit 109 may be configured to generate two oscillator signals with the same frequency with a 180-degree phase shift between the two oscillator signals.

In some embodiments, a frequency and/or phase shift of oscillator signals 302 may be based on control signals 106. As described below, respective delay values of variable-delay circuits, e.g., variable-delay circuit 108, may be adjusted using control signals 106. In some cases, changes due to operating conditions of delay-line subsystem 100 may be remediated by adjusting the values of control signals 106 based on periodic background calibration operations. By monitoring oscillator signals 302, variable-delay circuits included in delay-circuit 101 can be adjusted without a reference clock signal.

Control circuit 301 is configured to adjust respective values of control signals 106 based on oscillator signals 302. In various embodiments, control circuit 301 includes initial calibration circuit 303 and background calibration circuit 304. As described below, initial calibration circuit 303 and background calibration circuit 304 may both be implemented using any suitable combination of logic gates and transistors.

Figure 4:
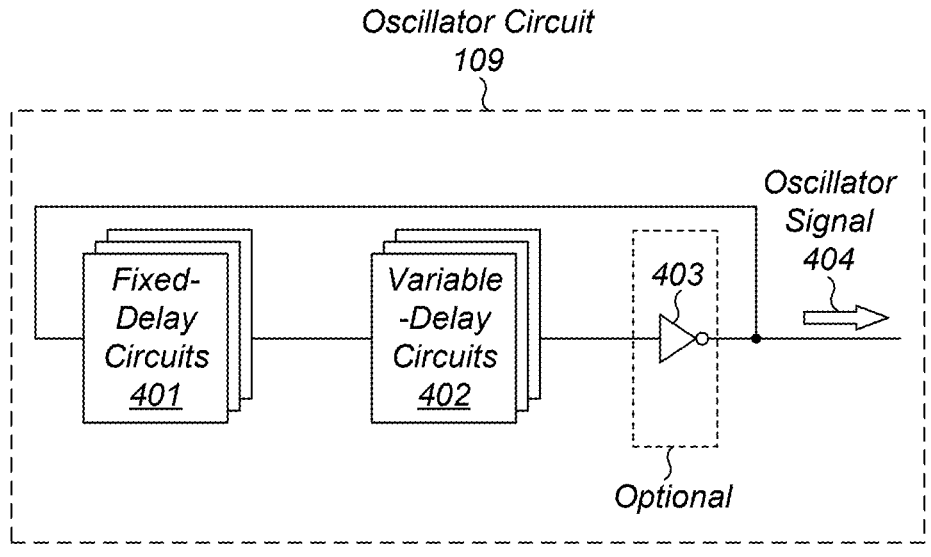
FIG. 4 is a block diagram depicting an embodiment of an oscillator circuit for a delay-line calibration circuit.

Turning to FIG. 4, a block diagram of oscillator circuit 109 is depicted. As illustrated, oscillator circuit 109 includes fixed-delay circuits 401, variable-delay circuits 402, and optional inverter 403.

Fixed-delay circuits 401 and variable-delay circuits 402 are coupled in series to form a ring oscillator circuit configured to generate oscillator signal 404. In various embodiments, oscillator signal 404 may correspond oscillator signal 302.

It is noted that although three fixed-delay circuits and three variable-delay circuits are depicted in the embodiment of FIG. 4, in other embodiments, any suitable number of both fixed-delay circuits and variable-delay circuits may be employed. In cases where there is an even number of stages in the combination of fixed-delay circuits 401 and variable-delay circuits 402, optional inverter 403 may be employed to generate an odd number of inversions to allow the ring oscillator circuit to function.

Although the embodiment of oscillator circuit 109 depicted in FIG. 4 is configured to generate a single oscillator signal, in other embodiments, oscillator circuit 109 may generate any suitable number of oscillator signals. In such cases, oscillator circuit 109 may be configured to generate the oscillator signals with different respective phases.

Inverter 403 may, in various embodiments, be implemented using a CMOS inverter. In other embodiments, any other suitable type of inverting amplifier circuits, including those implemented using technologies other than CMOS, may be employed.

Figure 5A:
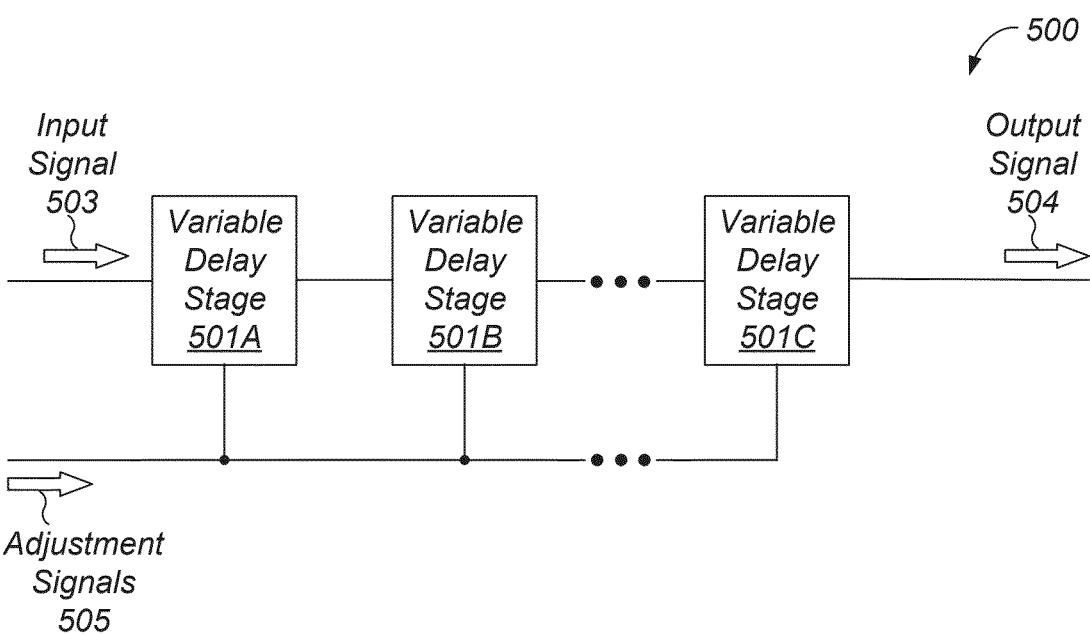
FIG. 5A is a block diagram depicting an embodiment of a variable-delay circuit.

Turning to FIG. 5A, a block diagram of an embodiment of a variable-delay circuit is depicted. As illustrated, variable-delay circuit 500 includes variable-delay stages 501A-501C. In various embodiments, variable-delay circuit 500 may correspond to any of variable-delay circuits 204 or 402 as depicted in FIG. 4.

Variable-delay stages 501A-501C are coupled together in series to generate a delayed version of input signal 503. Although only three stages are show in the embodiment of FIG. 5A, in other embodiments, any suitable number of variable-delay stages may be employed in order to generate a desired amount of delay between input signal 503 and output signal 504.

Variable-delay stages 501A-501C are further configured to adjust an amount of delay between their respective input signals and their respective output signals based on adjustment signals 505. In various embodiments, variable-delay stages 501A-501C can be adjusted together or individually.

Figure 5B:
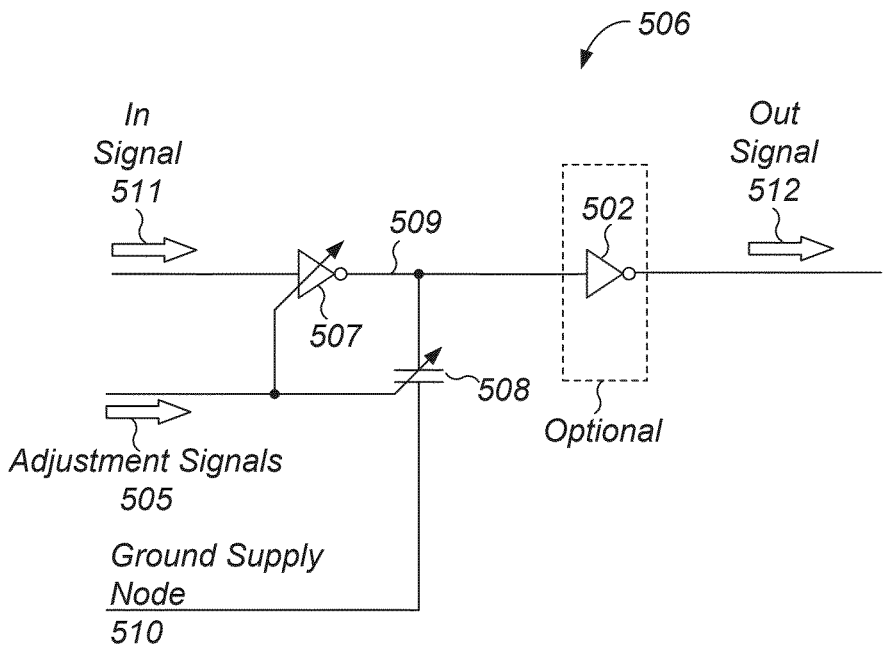
FIG. 5B is a block diagram depicting an embodiment of a variable-delay stage used in a variable-delay circuit.

Turning to FIG. 5B, a block diagram of a variable-delay stage is depicted. As illustrated, variable-delay stage 506 includes variable inverter 507 and variable capacitor 508. In various embodiments, variable-delay stage 506 may correspond to any of variable-delay stages 501A-501C.

Inverter 507 is configured to receive signal 511 and generate signal 512 on node 509 using signal 511. Variable capacitor 508 is coupled between node 509 and ground supply node 510.

When signal 511 transitions, variable inverter 507 sinks or sources current to node 509, causing the voltage of node 509 to decrease or increase, respectively. An amount of time from when signal 511 transitions to the corresponding transition on signal 512 is based on the rise/fall time of node 509. Variable inverter 507 is configured to adjust an amount of current that it sinks or sources to node 509 based on adjustment signals 505. When the amount of current that variable inverter 507 can sink or source to node 509 increases, the rise/fall time of node 509 decreases, thereby reducing the time period from when signal 511 transitions to the corresponding transition of signal 512. In a similar fashion, when the amount of current that variable inverter 507 sinks or sources to node 509 decreases, the rise/fall time of node 509 increases, thereby increasing the time period from when signal 511 transitions to the corresponding transition of signal 512.

In addition to changing the amount of current that inverter 507 can sink or source to node 509, variable capacitor 508 can be used to increase or decrease the amount of capacitance coupled to node 509 based on adjustment signals 505. When the value of variable capacitor 508 is increased, the rise/fall time of node 509 increases, thereby increasing the time period from when signal 511 transitions to the corresponding transition of signal 512. When the value of variable capacitor 508 is decreased, the rise/fall time of node 509 decreases, thereby reducing the time period from when signal 511 transitions to the corresponding transition of signal 512.

In various embodiments, adjustment signals 505 may be a digital signal that includes multiple bits. In some cases, a subset of the bits may be used to control variable inverter 507, and a different subset of the bits may be used to control variable capacitor 508. It is noted that variable inverter 507 and variable capacitor 508 can be adjusted individually or together.

In some embodiments, optional inverter 502 is coupled to node 509. Optional inverter 502 may be included to provide additional drive capability. Alternatively, or additionally, optional inverter 502 may be included to improve the slope of the output of variable-delay stage 506.

In various embodiments, variable inverter 507 may be implemented with multiple p-channel MOSFETs in parallel and multiple n-channel MOSFETs in parallel. Different numbers of the p-channel MOSFETs and the n-channel MOSFETs may be coupled to node 509 based on adjustment signals 505 in order to adjust an amount of current that variable inverter 507 can source to or sink from node 509. In various embodiments, variable inverter 507 may be implemented using technologies other than CMOS.

Variable capacitor 508 may include multiple capacitors and switches that couple different ones of the multiple capacitors between node 509 and ground supply node 510 based on adjustment signals 505. In various embodiments, the multiple capacitors may be implemented using metal-oxide-metal ("MOM") capacitor structures, metal-insulator-metal ("MIM") structures, or any other suitable capacitor structure available on a semiconductor manufacturing process.

It is noted that the embodiment depicted in FIG. 5B is merely an example. In other embodiments, different circuit techniques, e.g., variable power supply voltages, may be employed to adjust the delay of a signal propagating through variable-delay stage 506.

Figure 6:
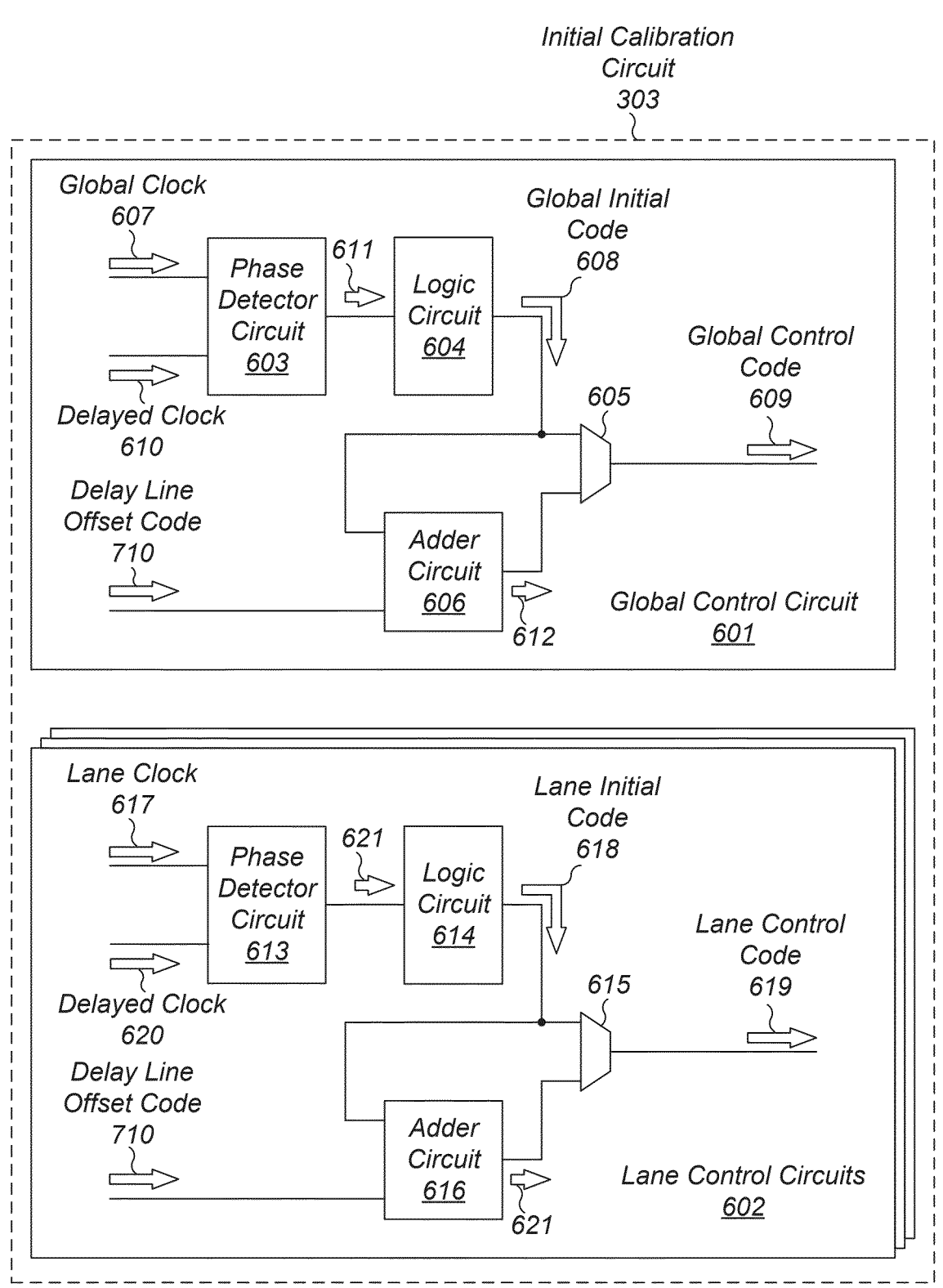
FIG. 6 is a block diagram depicting an embodiment of an initial calibration circuit.

Turning to FIG. 6, a block diagram of an embodiment of initial calibration circuit 303 is depicted. As illustrated, initial calibration circuit 303 includes global control circuit 601 and lane control circuits 602. It is noted that although three lane control circuits are shown, in other embodiments, any suitable number of lane control circuits may be employed.

Global control circuit 601 includes phase detector circuit 603, logic circuit 604, multiplex circuit 605, and adder circuit 606. A given one of lane control circuits 602 includes phase detector circuit 609, logic circuit 610, multiplex circuit 611, and adder circuit 612.

Phase detector circuit 603 is configured, during an initial calibration operation, to generate signal 611 using global clock 607 and delayed clock 610. In various embodiments, delayed clock 610 is a delayed version of global clock 607 generated by a given one of delay-line circuits 101. To generate signal 611, phase detector circuit 603 is further configured to compare respective phases of global clock 607 and delayed clock 610. In some cases, signal 611 may be a digital signal that includes multiple bits, where a value of the digital signal is proportional to the a phase difference between global clock 607 and delayed clock 610.

Logic circuit 604 is configured to generate global initial code 608. In various embodiments, logic circuit 604 may be implemented using a microcontroller or any other suitable combination of combinatorial and sequential logic circuits.

Adder circuit 606 is configured to combine delay line offset code 710 and global initial code 608 to generate signal 612. In various embodiments, to combine delay line offset code 710 and global initial code 608, adder circuit 606 may be further configured to add delay line offset code 710 and global initial code 608. Adder circuit 606 may be implemented using full-adder circuits, carry-lookahead circuits, or any other suitable adder circuits.

Multiplex circuit 605 is configured to select one of global initial code 608 or signal 612 to generate global control code 609 based on a type of calibration operation being performed. For example, during an initial calibration operation, multiplex circuit 605 is configured to select global initial code 608 to generate global control code 609, while during a background calibration operation, multiplex circuit 605 is configured to select signal 612 to generate global control code 609. Multiplex circuit 605 may be implemented using multiple pass-gate circuits coupled together in a wired-OR fashion, or any suitable combination of logic gates configured to implement a selection function.

Phase detector circuit 613 is configured, during an initial calibration operation, to generate signal 621 using lane clock 607 and delayed clock 620. In various embodiments, delayed clock 621 is a delayed version of lane clock 617 generated by a given one of delay-line circuits 101. In various embodiments, different ones of lane control circuits 602 can use different lane clocks and their corresponding delayed versions. To generate signal 621, phase detector circuit 613 is further configured to compare respective phases of lane clock 617 and delayed clock 620. In some cases, signal 621 may be a digital signal that includes multiple bits, where a value of the digital signal is proportional to the a phase difference between lane clock 617 and delayed clock 621.

Logic circuit 614 is configured to generate lane initial code 618. In various embodiments, logic circuit 614 may be implemented using a microcontroller or any other suitable combination of combinatorial and sequential logic circuits.

Adder circuit 616 is configured to combine delay line offset code 710 and lane initial code 618 to generate signal 621. In various embodiments, to combine delay line offset code 710 and lane initial code 619, adder circuit 616 may be further configured to add delay line delay line offset code 710 and lane initial code 618. Adder circuit 616 may be implemented using full-adder circuits, carry-lookahead circuits, or any other suitable adder circuits.

Multiplex circuit 615 is configured to select one of lane initial code 618 or signal 621 to generate lane control code 619 based on a type of calibration operation being performed. For example, during an initial calibration operation, multiplex circuit 615 is configured to select lane initial code 618 to generate lane control code 619, while during a background calibration operation, multiplex circuit 615 is configured to select signal 621 to generate lane control code 619. Multiplex circuit 615 may be implemented using multiple pass-gate circuits coupled together in a wired-OR fashion, or any suitable combination of logic gates configured to implement a selection function.

Figure 7:
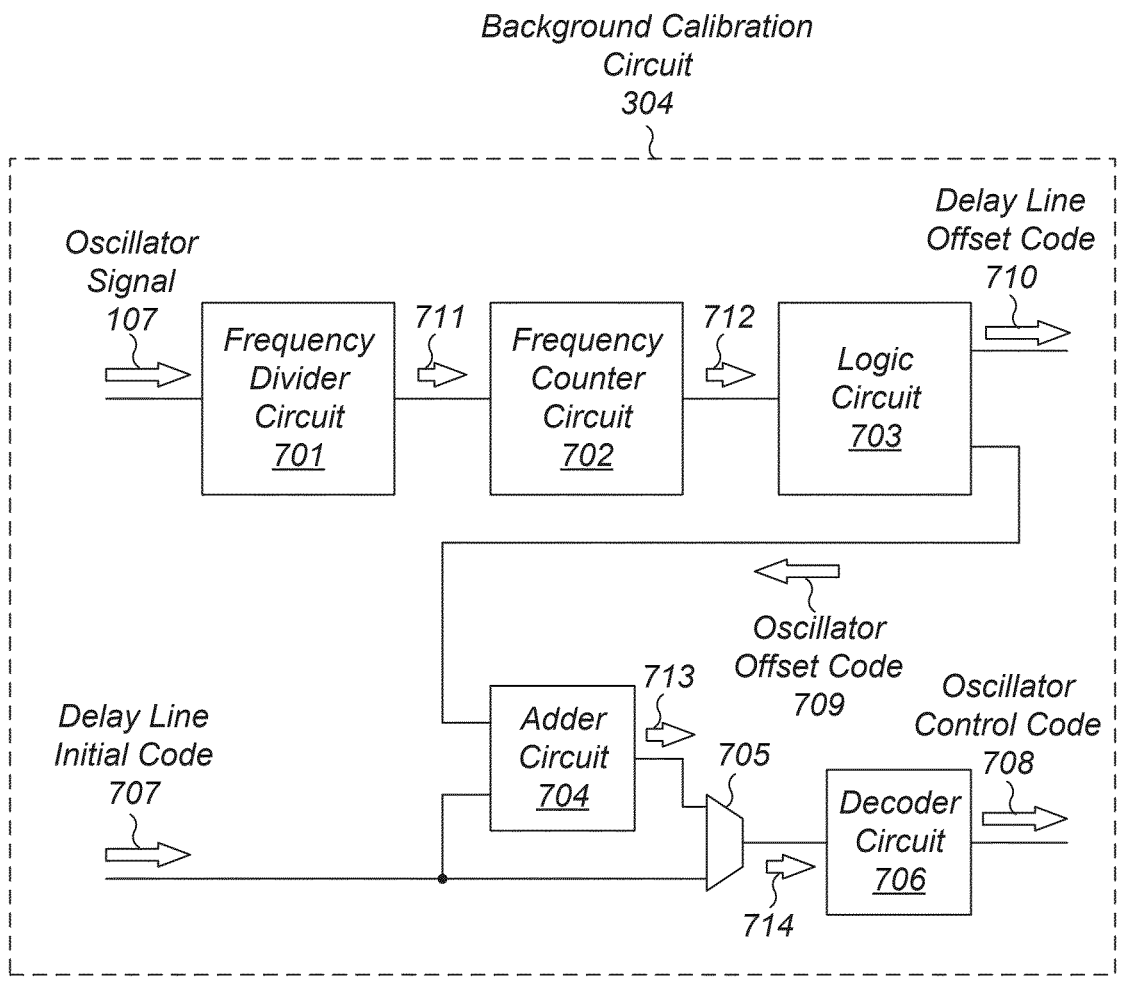
FIG. 7 is a block diagram depicting an embodiment of a background calibration circuit.

Turning to FIG. 7, a block diagram of an embodiment of background calibration circuit 304 is depicted. As illustrated, background calibration circuit 304 includes frequency divider circuit 701, frequency counter circuit 702, logic circuit 703, adder circuit 704, multiplex circuit 705, and decoder circuit 706.

Frequency divider circuit 701 is configured to receive oscillator signal 107 and generate signal 711 which is a reduced-frequency version of oscillator signal 107. In various embodiments, frequency divider circuit 701 may be implemented using one or more flip-flop circuits coupled in series. In some embodiments, frequency divider circuit 701 may be configured to generate the reduced-frequency version of oscillator signal 107 such that a ratio of oscillator signal 107 to signal 622 version is a integer value.

Frequency counter circuit 702 is configured to generate signal 712 which includes a count value that corresponds to a frequency of signal 711. In various embodiments, frequency counter circuit 702 may count a number of clock edges of signal 711 over a particular period of time. In various embodiments, frequency counter circuit 702 may be implemented using a ripple counter or any other suitable counter circuit.

Logic circuit 703 is configured to generate delay line offset code 710 and oscillator offset code 709 using signal 712. To generate delay line offset code 710 and oscillator offset code 709, logic circuit 703 is further configured to adjust the values of delay line offset code 710 and oscillator offset code based on variations in signal 712 during background calibration operations. As described above, delay line offset code 710 may be added to different initial codes, e.g., global initial code 608 and lane initial code 614, to generate control codes for different ones of variable-delay circuits include in delay-line circuits 101.

In some embodiments, logic circuit 703 may be configured to generate delay line offset code 710 and oscillator offset code 709 using a predetermined ratio. For example, in some cases, the ratio of delay line offset code 710 to oscillator offset code 709 may be 1/2. In various embodiments, logic circuit 703 may be implemented using a microcontroller or any other suitable combination of combinatorial and sequential logic circuits.

Adder circuit 704 is configured to combine delay line initial code 707 and oscillator offset code 709 to generate signal 713. It is noted that delay line initial code 707 may, in some embodiments, correspond to global initial code 608 or any one of the lane initial code 614 signals included in respective ones of lane control circuits 602 as depicted in FIG. 6. In various embodiments, to combine delay line initial code 707 and oscillator offset code 709, adder circuit 704 may be further configured to add delay line initial code 707 and oscillator offset code 709. Adder circuit 704 may be implemented using full-adder circuits, carry-lookahead circuits, or any other suitable adder circuits.

Multiplex circuit 705 is configured to select one of signal 713 and delay line initial code 707 to generate signal 714 based on a type of calibration operation being performed. For example, during an initial calibration operation, multiplex circuit 705 is configured to select delay line initial code 707 to generate signal 714, while during a background calibration operation, multiplex circuit 705 is configured to select signal 713 to generate signal 713. Multiplex circuit 705 may be implemented using multiple pass-gate circuits coupled together in a wired-OR fashion, or any suitable combination of logic gates configured to implement a selection function.

Decoder circuit 706 is configured to perform a decode operation on signal 714 to generate oscillator code 708. It is noted that, in some embodiments, oscillator control code 708 may have a predetermined relationship with the different versions of lane control code 619. For example, in some cases, a ratio of a given lane control code 619 to oscillator control code 708 may be 3/2. In various embodiments, decoder circuit 706 may be implemented using any suitable combination of logic gates arranged to implement the desired decode function.

Figure 8:
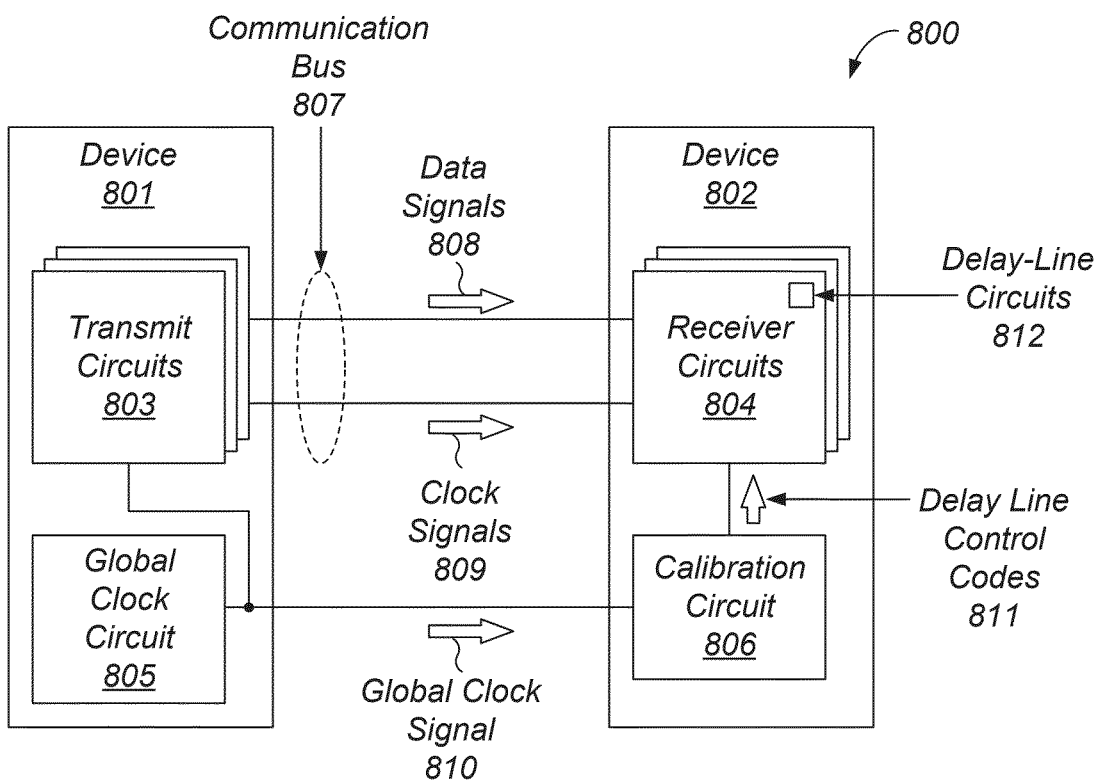
FIG. 8 is a block diagram depicting an embodiment of a computer system that transmits data between two devices.

Turning to FIG. 8, a block diagram of a computer system is depicted. As illustrated, computer system 800 includes device 801 and device 802 that are coupled together via communication bus 807. In various embodiments, communication bus 807 may employ one of various communication protocols such as Peripheral Component Interface ("PCI"), or any other suitable communication protocol.

Device 801 includes transmit circuits 803 and global clock circuit 805. Transmit circuits 804 are configured to transmit data signals 808 and clock signals 809 over corresponding lanes included in communication bus 807. In some embodiments, transmit circuit 804 may be configured to generate clock signals 809 using global clock signal 810. Although three transmit circuits are depicted in the embodiment of FIG. 8, in other embodiments, device 801 may employ any suitable number of transmit circuits.

Global clock circuit 805 which is configured to generate global clock signal 810. Global clock circuit 805 may be further configured to transmit global clock signal 810 to transmit circuits 804 and, optionally, to device 802. In various embodiments, global clock circuit 805 may be implemented using crystal oscillator circuits, phase-locked loop circuits, delay-locked loop circuits, digitally controlled delay-line circuits, or any other circuit suitable for clock signal generation.

Device 802 includes receiver circuits 804 and calibration circuit 806. Receiver circuits 804 are configured to receive data signal 808 and clock signals 809. In various embodiments, receiver circuits 804 are further configured to process data signals 808 and clock signals 809 to extract data encoded in data signals 808. To process data signals 808, receiver circuits may be configured to amplify and/or filter data signals 808, and then sampling the resultant signal. Although three receiver circuits are depicted in the embodiment of FIG. 8, in other embodiments, device 802 may employ any suitable number of receiver circuits.

Receiver circuits 804 include delay-line circuits 812. In some embodiments, each of receiver circuits 804 may include at least one of delay-line circuits 812 which may correspond to delay-line circuits 101 as depicted in FIG. 1. Receiver circuits 804 may be configured to generate, using delay-line circuits 812, multi-phase clock signals from clock signals 809. Such multi-phase clock signals may be used to sample both data and edges, i.e., transitions between symbols in data signals 808, as part of a clock-data recovery operation.

Calibration circuit 806 may, in different embodiments, correspond to calibration circuit 102 as depicted in FIG. 2. In various embodiments, calibration circuit 806 is configured to perform calibration operations for delay-line circuits 812. In some embodiments, calibration circuit 806 may configured to use global clock signal 810 as part of an initial calibration operation. Alternatively, in other embodiments, calibration circuit 806 may be configured to use an output of any of delay-line circuits 812 during the initial calibration operation.

It is noted that both device 801 and device 802 may include numerous other circuit blocks which have been omitted from FIG. 8 for clarity. For example, in various embodiments, both device 801 and device 802 may include memory circuits, processor circuits, input/output circuits, and the like.

To summarize, various embodiments of a calibration system for a delay-line circuit are disclosed. Broadly speaking, a delay-line circuit may include a plurality of variable-delay circuits, and be configured to generate at least one output signal using an input signal, where the output signal is a delayed version of the input signal. A calibration circuit may include an oscillator circuit that may be configured to generate an oscillator signal. The calibration circuit may include a particular variable-delay circuit that is a replica of a given variable-delay circuit of the plurality of variable-delay circuits. The calibration circuit may be configured to perform an initial calibration of the delay-line circuit and perform, in response to a determination that the initial calibration has completed, a background calibration of the delay-line circuit using the oscillator signal.

Turning to FIG. 9, a flow diagram depicting an embodiment of a method for calibrating a delay line circuit is illustrated. The method, which may be applied to various delay-line subsystems, e.g., delay-line subsystem 100 as depicted in FIG. 1, begins in block 901. In various embodiments, the delay-line subsystem can include a calibration circuit and one or more delay-line circuits. In some cases, the one or more delay-line circuits may be employed to generate multi-phase clock signals in corresponding ones of receiver circuits used in multi-lane communication systems.

The method includes performing, by a calibration circuit an initial calibration of the one or more delay-line circuits that includes a plurality of variable-delay circuits (block 902). As described below, performing the initial calibration of the one or more delay-line circuits includes determining initial delay settings for the plurality of variable-delay circuits. In some embodiments, determining the initial delay settings for the plurality of variable-delay circuits, includes generating corresponding code values for the one or more delay-line circuits, wherein the code values include information indicative of the initial delay settings.

In various embodiments, the method may include performing the initial calibration operation in response to a reset of a computer system that includes the delay-line subsystem. In other embodiments, the method may include performing the initial calibration operation in response to a power-up operation of the computer system that includes the delay-line circuit.

The method further includes performing, by the calibration circuit in response to completing the initial calibration operation, a background calibration operation of the one or more delay-line circuits using at least one oscillator signal generated by an oscillator circuit included in the calibration circuit (block 903). In various embodiments, the oscillator circuit may include a replica of at least one variable-delay circuit of the plurality of variable-delay circuits included in the one or more delay-line circuits. In various embodiments, by using the oscillator signal the use of an always active reference clock signal can be avoided, thereby saving power. As described below, performing the background calibration operation includes determining a first offset code for the oscillator circuit and a second offset code for the one or more delay-line circuits. In various embodiments, the first offset code include information indicative of delay settings the variable-delay circuits included in the oscillator circuit, and the second offset code includes information indicative of delay settings for the variable-delay circuits included in the one or more delay-line circuit.

In various operations, the method may also include performing the background calibration operation at periodic intervals. In some embodiments, a duration of a given periodic interval may be programmable. Alternatively, or additionally, the duration of the given periodic internal may be a function of one or more operating conditions of the delay-line circuit, e.g., power supply voltage for the delay-line circuit, temperature of the delay-line circuit, and the like. The method concludes in block 904.

Figure 10:
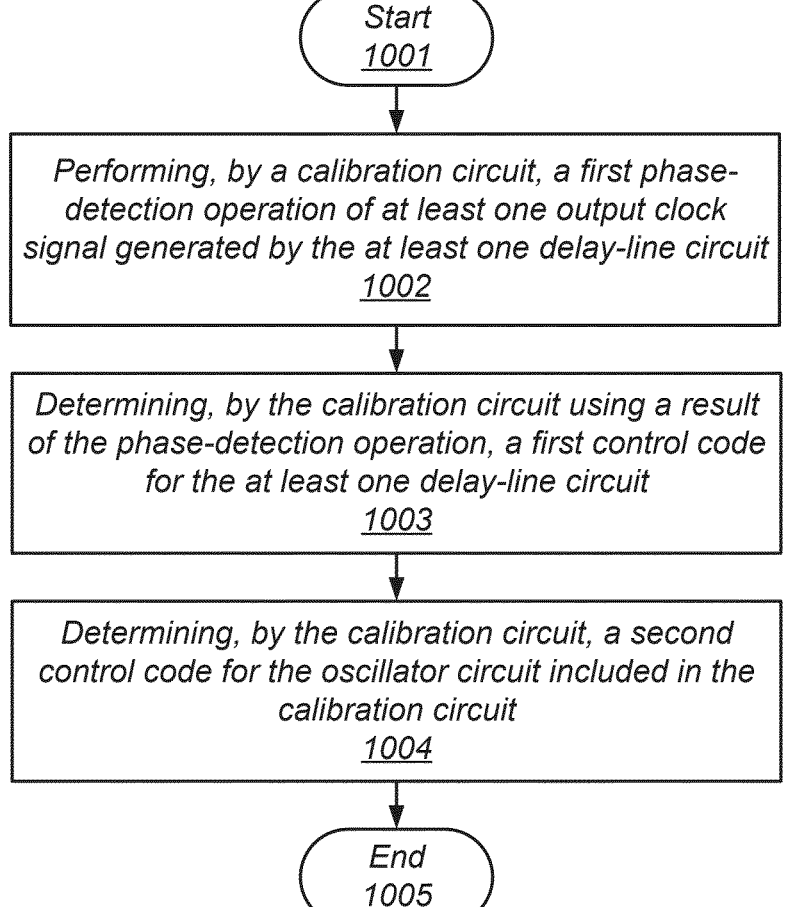
FIG. 10 is a flow diagram depicting an embodiment of a method for performing an initial calibration operation of a delay-line circuit.

Turning to FIG. 10, a flow diagram depicting an embodiment of a method for performing an initial calibration operation of a delay-line circuit is illustrated. In various embodiments, the method depicted in the flow diagram of FIG. 10 may correspond to block 902 of the flow diagram illustrated in FIG. 9. The method begins in block 1001.

The method includes performing, by the calibration circuit, a phase-detection operation of at least one output clock signal generated by the at least one delay-line circuit (block 1002). In various embodiments, performing the phase-detection operation includes comparing respective phases of the at least one output clock signal and a corresponding input clock signal.

The method further includes determining, by the calibration circuit using a result of the first duty cycle monitoring operation, a first control code for the at least one delay-line circuit (block 1003). In various embodiments, determining the first control code may include setting the first control code to a value based on a phase difference between the at least one output clock signal and the corresponding input clock signal.

The method also includes determining, by the calibration circuit, a second control code for the oscillator circuit included in the calibration circuit (block 1004). In various embodiments, determining the second control code may include setting the second control code to a value of the first control code. The method concludes in block 1005.

Figure 11:
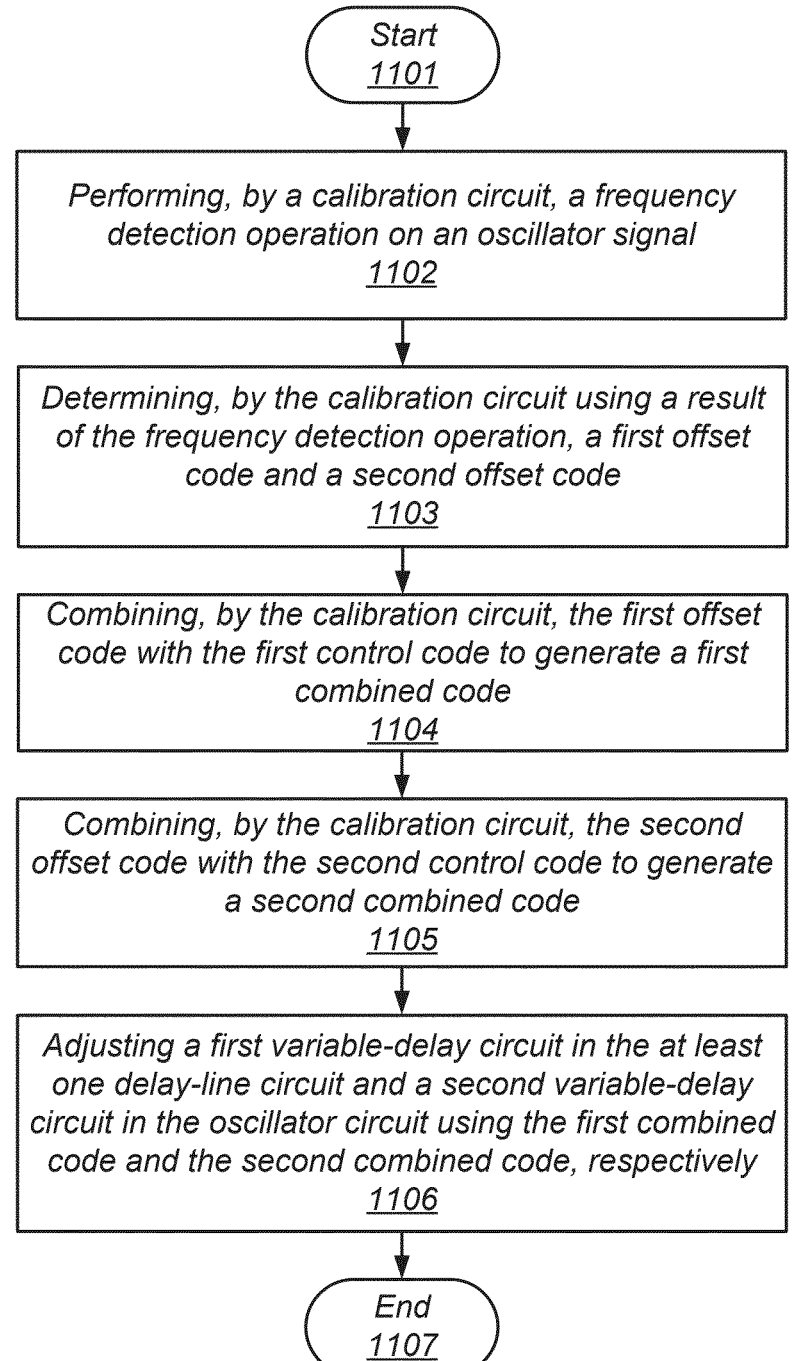
FIG. 11 is a flow diagram depicting an embodiment of a method for performing a background calibration operation of a delay-line circuit.

Turning to FIG. 11, a flow diagram depicting an embodiment of a method for performing a background calibration operation of a delay-line circuit is illustrated. In various embodiments, the method depicted in the flow diagram of FIG. 11 may correspond to block 903 of the flow diagram illustrated in FIG. 9. The method begins in block 1101.

The method includes performing, by a calibration circuit, a frequency detection operation on an oscillator signal (block 1102). In various embodiments, performing the frequency detection operation includes generating, by a frequency-divider circuit, a reduced frequency signal using the oscillator signal, where a first frequency of the reduced frequency signal is less than a second frequency of the oscillator signal. Performing the frequency detection operation may additionally include determining, by a frequency-counter circuit, a frequency of the reduced-frequency signal.

The method further includes determining, by the calibration circuit using a result of the frequency detection operation, a first offset code and a second offset code (block 1103). In various embodiments, determining the first offset code and the second offset code may include determining a difference between the frequency of the reduced-frequency signal and a target frequency. In some embodiments, there is a predetermined relationship between the first offset code and the second offset code. For example, in some cases, a ratio between the first offset code and the second offset code may be 1/2.

The method also includes combining, by the calibration circuit, the first offset code with the first control code to generate a first combined code (block 1104). In various embodiments, combining the first offset code and the first control code may include adding the first offset code to the first control code to generate the first combined code.

The method further includes combining, by the calibration circuit, the second offset code with the second control code to generate a second combined code (block 1105). In various embodiments, combining the second offset code with the second control code includes adding the second offset code to the second control code to generate the second combined code. In some embodiments, there is a predetermined relation between the first combined code and the second combined code. For example, in some cases, a ratio between the first combined code and the second combined code is 3/2.

The method also includes adjusting a first variable-delay circuit in the at least one delay-line circuit and a second variable-delay circuit in the oscillator circuit using the first combined code and the second combined code, respectively (block 1106). In various embodiments, adjusting the first variable-delay circuit includes adding capacitance to an output of a variable inverter included in the first variable-delay circuit. In other embodiments, adjusting the first variable-delay circuit includes changing a drive strength of the variable inverter included in the first variable-delay circuit. The method concludes in block 1107.

Figure 12:
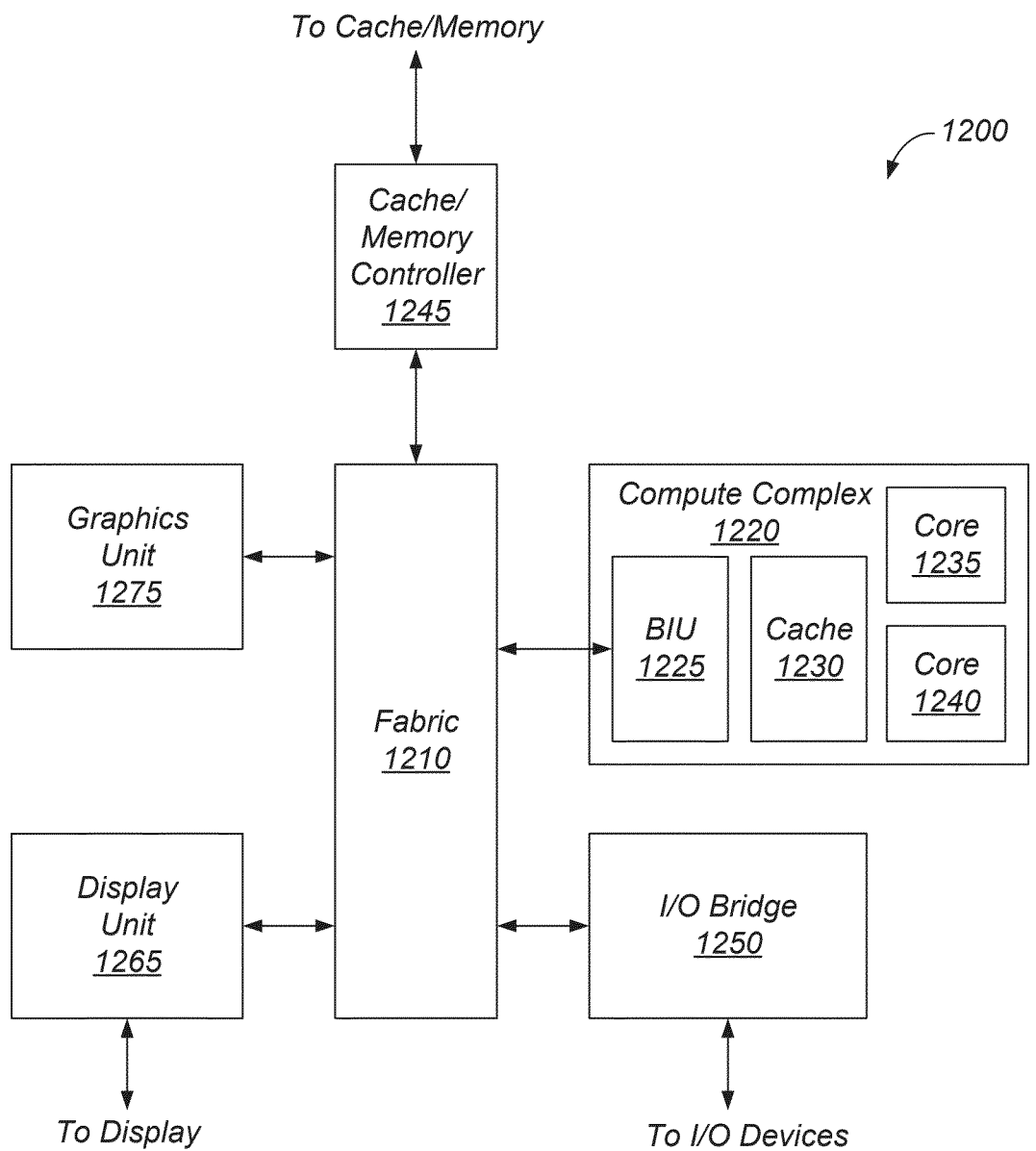
FIG. 12 is a block diagram of an embodiment of a device that includes delay-line subsystems.

Referring now to FIG. 12, a block diagram illustrating an example embodiment of a device is shown that may include aggregator circuits and an aggregation processor. In various embodiments, device 1200 may implement functionality of calibration circuit 102 as depicted in FIG. 1. In some embodiments, elements of device 1200 may be included within a system on a chip. In some embodiments, device 1200 may be included in a mobile device, which may be battery-powered. Therefore, power consumption by device 1200 may be an important design consideration. In the illustrated embodiment, device 1200 includes fabric 1210, compute complex 1220, input/output (I/O) bridge 1250, cache/memory controller 1245, graphics unit 1275, and display unit 1265. In some embodiments, device 1200 may include other components (not shown) in addition to, or in place of, the illustrated components, such as video processor encoders and decoders, image processing or recognition elements, computer vision elements, etc.

Fabric 1210 may include various interconnects, buses, MUX's, controllers, etc., and may be configured to facilitate communication between various elements of device 1200. In some embodiments, portions of fabric 1210 may be configured to implement various different communication protocols. In other embodiments, fabric 1210 may implement a single communication protocol, and elements coupled to fabric 1210 may convert from the single communication protocol to other communication protocols internally.

In the illustrated embodiment, compute complex 1220 includes bus interface unit (BIU) 1225, cache 1230, and cores 1235 and 1240. In various embodiments, compute complex 1220 may include various numbers of processors, processor cores, and caches. For example, compute complex 1220 may include 1, 2, or 4 processor cores, or any other suitable number. In one embodiment, cache 1230 is a set associative L2 cache. In some embodiments, cores 1235 and 1240 may include internal instruction and data caches. In some embodiments, a coherency unit (not shown) in fabric 1210, cache 1230, or elsewhere in device 1200, may be configured to maintain coherency between various caches of device 1200. BIU 1225 may be configured to manage communication between compute complex 1220 and other elements of device 1200. Processor cores, such as cores 1235 and 1240, may be configured to execute instructions of a particular instruction set architecture (ISA) which may include operating system instructions and user application instructions. These instructions may be stored in a computer readable medium such as a memory coupled to cache memory controller 1245 as discussed below.

As used herein, the term "coupled to" may indicate one or more connections between elements, and a coupling may include intervening elements. For example, in FIG. 12, graphics unit 1275 may be described as "coupled to" a memory through fabric 1210 and cache/memory controller

1245. In contrast, in the illustrated embodiment of FIG. 12, graphics unit 1275 is "directly coupled" to fabric 1210 because there are no intervening elements.

Cache/memory controller 1245 may be configured to manage transfer of data between fabric 1210 and one or more caches and memories. For example, cache/memory controller 1245 may be coupled to an L3 cache, which may, in turn, be coupled to a system memory. In other embodiments, cache/memory controller 1245 may be directly coupled to a memory. In some embodiments, cache/memory controller 1245 may include one or more internal caches. Memory coupled to cache/memory controller 1245 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 1245 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 1220 to cause the computing device to perform functionality described herein.

Graphics unit 1275 may include one or more processors, e.g., one or more graphics processing units (GPUs). Graphics unit 1275 may receive graphics-oriented instructions, such as OPENGL®, Metal®, or DIRECT3D® instructions, for example. Graphics unit 1275 may execute specialized GPU instructions or perform other operations based on the received graphics-oriented instructions. Graphics unit 1275 may generally be configured to process large blocks of data in parallel, and may build images in a frame buffer for output to a display, which may be included in the device or may be a separate device. Graphics unit 1275 may include transform, lighting, triangle, and rendering engines in one or more graphics processing pipelines. Graphics unit 1275 may output pixel information for display images. Graphics unit 1275, in various embodiments, may include programmable shader circuitry which may include highly parallel execution cores configured to execute graphics programs, which may include pixel tasks, vertex tasks, and compute tasks (which may or may not be graphics-related).

Display unit 1265 may be configured to read data from a frame buffer and provide a stream of pixel values for display. Display unit 1265 may be configured as a display pipeline in some embodiments. Additionally, display unit 1265 may be configured to blend multiple frames to produce an output frame. Further, display unit 1265 may include one or more interfaces (e.g., MIPI® or embedded display port (eDP)) for coupling to a user display (e.g., a touchscreen or an external display).

I/O bridge 1250 may include various elements configured to implement universal serial bus (USB) communications, security, audio, and low-power always-on functionality, for example. I/O bridge 1250 may also include interfaces such as pulse-width modulation (PWM), general-purpose input/output (GPIO), serial peripheral interface (SPI), and interintegrated circuit (I2C), for example. Various types of peripherals and devices may be coupled to device 1200 via I/O bridge 1250.

In some embodiments, device 1200 includes network interface circuitry (not explicitly shown), which may be connected to fabric 1210 or I/O bridge 1250. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 1200 with connectivity to various types of other devices and networks.

Figure 13:
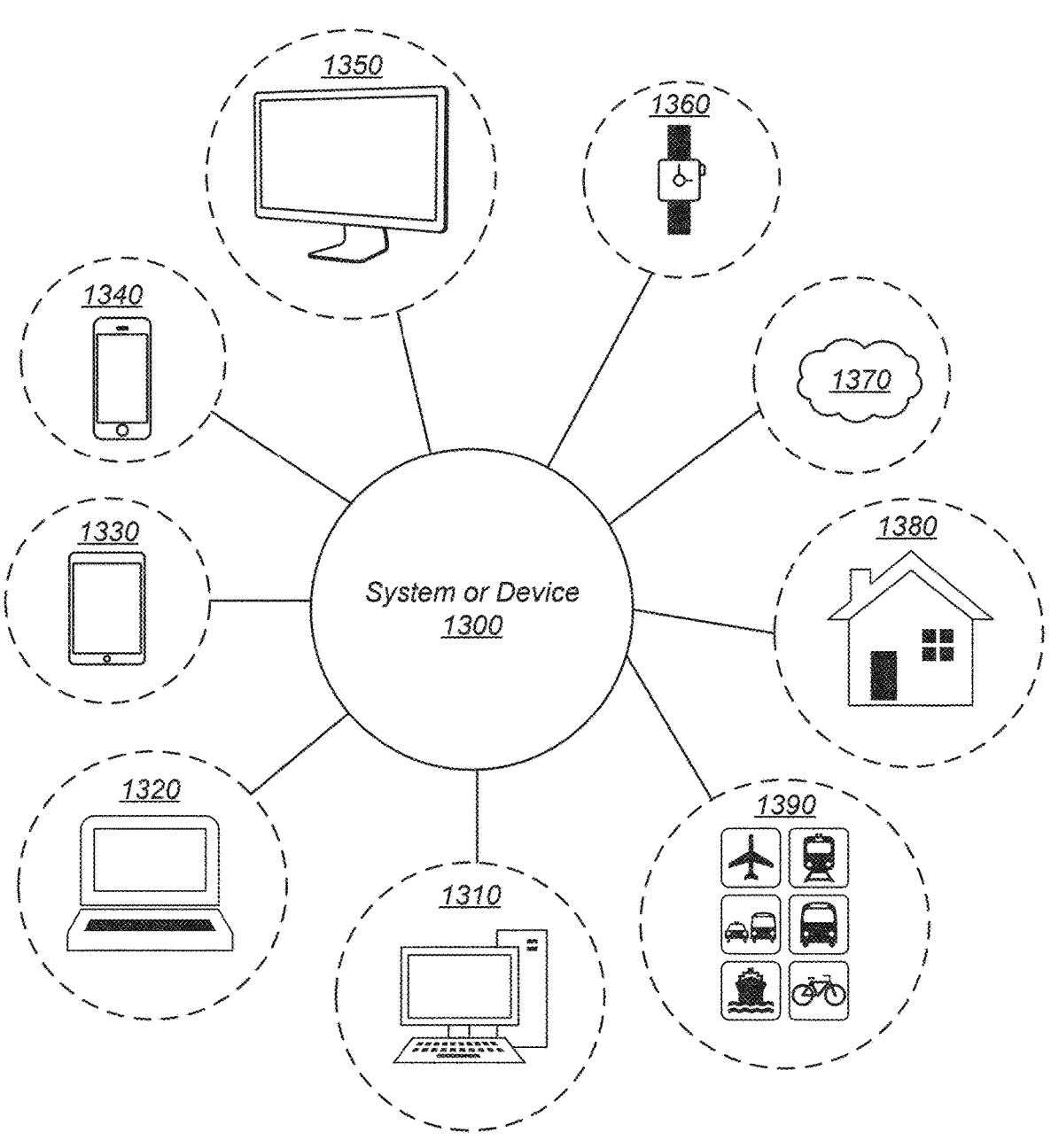
FIG. 13 is a block diagram of various embodiments of computer systems that may include delay-line subsystems.

Turning now to FIG. 13, various types of systems that may include any of the circuits, devices, or systems discussed above are illustrated. System or device 1300, which may incorporate or otherwise utilize one or more of the techniques described herein, may be utilized in a wide range of areas. For example, system or device 1300 may be utilized as part of the hardware of systems such as a desktop computer 1310, laptop computer 1320, tablet computer 1330, cellular or mobile phone 1340, or television 1350 (or set-top box coupled to a television).

Similarly, disclosed elements may be utilized in a wearable device 1360, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1300 may also be used in various other contexts. For example, system or device 1300 may be utilized in the context of a server computer system, such as a dedicated server or on shared hardware that implements a cloud-based service 1370. Still further, system or device 1300 may be implemented in a wide range of specialized everyday devices, including devices 1380 commonly found in the home such as refrigerators, thermostats, security cameras, etc. The interconnection of such devices is often referred to as the "Internet of Things" (IoT). Elements may also be implemented in various modes of transportation. For example, system or device 1300 could be employed in the control systems, guidance systems, entertainment systems, etc. of various types of vehicles 1390.

The applications illustrated in FIG. 13 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as design simulation, design synthesis, circuit fabrication, etc.

Figure 14:
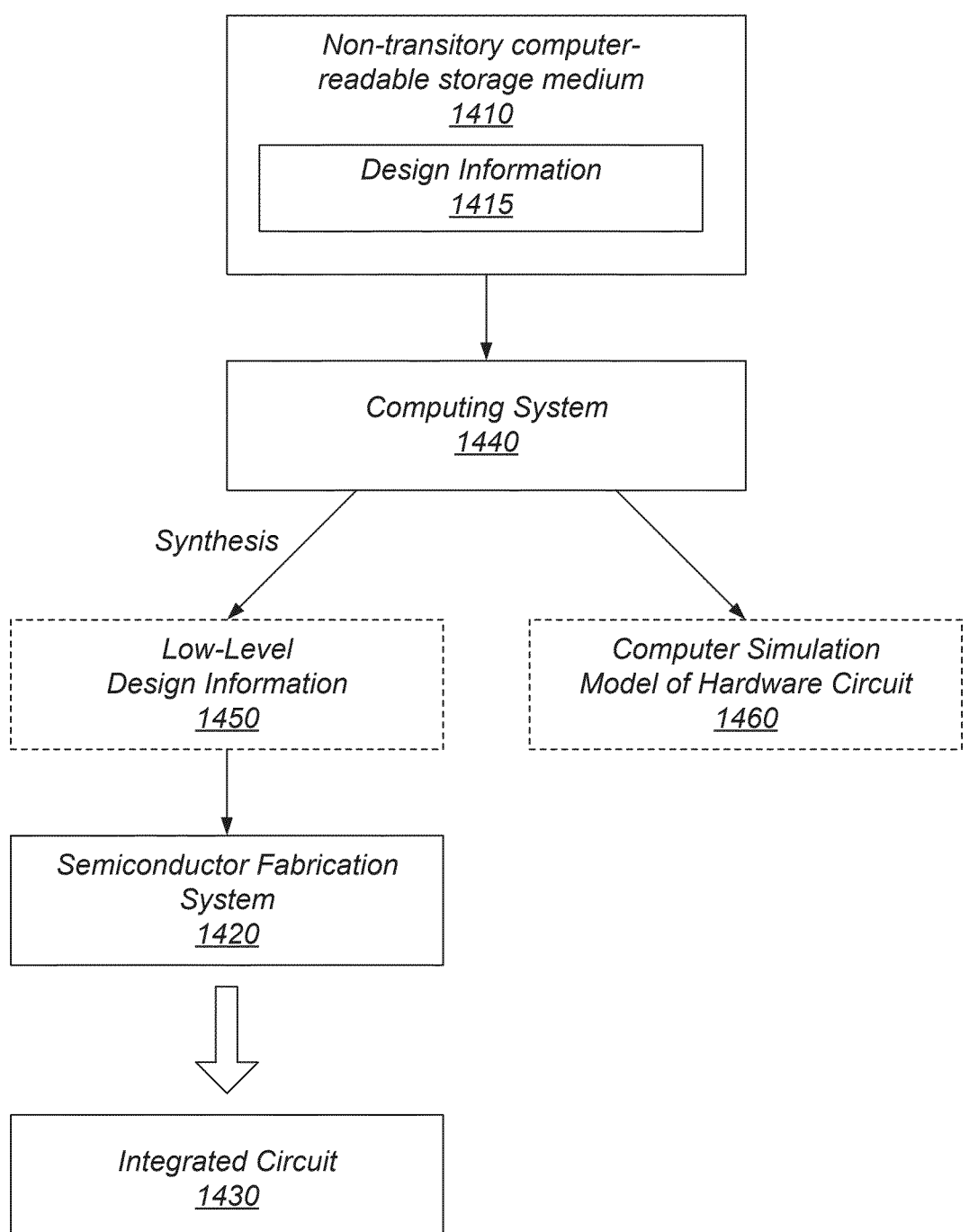
FIG. 14 illustrates an example of a non-transitory computer-readable storage medium that stores design information.

FIG. 14 is a block diagram illustrating an example of a non-transitory computer-readable storage medium that stores design information 1415, according to some embodiments. In the illustrated embodiment, computing system 1440 is configured to process design information 1415. This may include executing instructions included in design information 1415, interpreting instructions included in design information 1415, compiling, transforming, or otherwise updating design information 1415, etc. Therefore, design information 1415 controls computing system 1440 (e.g., by programming computing system 1440) to perform various operations discussed below, in some embodiments.

In the illustrated example, computing system 1440 processes design information 1415 to generate both computer simulation model of hardware circuit 1460 and low-level design information 1450. In other embodiments, computing system 1440 may generate only one of these outputs, may generate other outputs based on design information 1415, or both. Regarding computer simulation model of hardware circuit 1460, computing system 1340 may execute instructions of a hardware description language that includes register transfer level (RTL) code, behavioral code, structural code, or some combination thereof. The simulation model may perform the functionality specified by design information 1415, facilitate verification of the functional correctness of the hardware design, generate power consumption estimates, generate timing estimates, etc.

In the illustrated example, computing system 1440 also processes design information 1415 to generate low-level design information 1450 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 1450 (potentially among other inputs), semiconductor fabrication system 1420 is configured to fabricate integrated circuit 1430 (which may correspond to functionality of the computer simulation model of hardware circuit 1460). Note that computing system 1440 may generate different simulation models based on design information at various levels of description, including low-level design information 1450, design information 1415, and so on. The data representing low-level design information 1450 and computer simulation model of hardware circuit 1460 may be stored on non-transitory computer-readable storage medium 1410, or on one or more other media.

In some embodiments, low-level design information 1450 controls (e.g., programs) semiconductor fabrication system 1420 to fabricate integrated circuit 1430. Thus, when processed by the fabrication system, the design information may program the fabrication system to fabricate a circuit that includes various circuitry disclosed herein.

Non-transitory computer-readable storage medium 1410 may comprise any of various appropriate types of memory devices or storage devices. Non-transitory computer-readable storage medium 1410 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1410 may include other types of non-transitory memory as well, or combinations thereof. Accordingly, non-transitory computer-readable storage medium 1410 may include two or more memory media, which may reside in different locations for example, in different computer systems that are connected over a network.

Design information 1415 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 1440, semiconductor fabrication system 1420, or both. In some embodiments, design information 1415 may also include one or more cell libraries that specify the synthesis, layout, or both of integrated circuit 1430. In some embodiments, design information 1415 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1430 may, in various embodiments, include one or more custom macrocells, such as memories, analog or mixed-signal circuits, and the like. In such cases, design information 1415 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1420 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1420 may also be configured to perform various testing of fabricated circuits for correct operation.

In various embodiments, integrated circuit 1430 and computer simulation model of hardware circuit 1460 are configured to operate according to a circuit design specified by design information 1415, which may include performing any of the functionality described herein. For example, integrated circuit 1430 may include any of various elements shown in FIGS. 1-8. Further, integrated circuit 1430 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 1415. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 1415 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 1450. Low-level design information 1450 may program semiconductor fabrication system 1420 to fabricate integrated circuit 1430.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry. The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:
a first delay-line circuit that includes a plurality of variable-delay circuits, wherein the first delay-line circuit is configured to generate at least one output signal using an input signal, and wherein the at least one output signal is a delayed version of the input signal; and
a calibration circuit that includes an oscillator circuit configured to generate an oscillator signal, wherein the oscillator circuit includes a particular variable-delay circuit that is a replica of a given variable-delay circuit of the plurality of variable-delay circuits, wherein the calibration circuit is configured to:
perform, as part of an initial calibration of the first delay-line circuit, a first phase-detection operation using the at least one output signal and the input signal;
determine, as part of the initial calibration, a first control code using a first result of the first phase-detection operation;
determine, as part of the initial calibration, a second control code using the first result of the first phase-detection operation; and
perform, in response to a determination that the initial calibration has completed, a background calibration of the first delay-line circuit using the oscillator signal.

2. The apparatus of claim 1, wherein the calibration circuit is further configured to:
adjust a first delay value of at least one variable-delay circuit of the plurality of variable-delay circuits using the first control code; and
adjust a second delay value of the particular variable-delay circuit using the second control code.

3. The apparatus of claim 1, further comprising a second delay-line circuit configured to generate a global output signal using a global input signal, wherein the global output signal is a delayed version of the global input signal, and wherein the calibration circuit is further configured to:
perform a second phase-detection operation using the global input signal and the global output signal; and
determine the second control code using a second result of the second phase-detection operation.

4. The apparatus of claim 1, wherein to perform the background calibration, the calibration circuit is further configured to:

perform a frequency detection operation on the oscillator signal;
determine, using a result of the frequency detection operation, a first offset code and a second offset code;
combine the first offset code with the first control code to generate a first combined code;
combine the second offset code with the second control code to generate a second combined code;
adjust a first delay value of at least one variable-delay circuit of the plurality of variable-delay circuits using the first combined code; and
adjust a second delay value of the particular variable-delay circuit using the second combined code.

5. The apparatus of claim 4, wherein to perform the frequency detection operation, the calibration circuit is further configured to:
generate a reduced-frequency signal using the oscillator signal, wherein a first frequency of the reduced-frequency signal is less than a second frequency of the oscillator signal; and
determine a frequency of the reduced-frequency signal.

6. The apparatus of claim 1, wherein the calibration circuit is further configured to perform the background calibration at regular time intervals.

7. A method, comprising:
performing, by a calibration circuit that includes an oscillator circuit, an initial calibration of at least one delay line circuit that includes a plurality of variable-delay circuits, wherein the oscillator circuit includes a replica of at least one variable-delay circuit of the plurality of variable-delay circuits, and wherein the oscillator circuit is configured to generate at least one oscillator signal, wherein performing the initial calibration includes:
generating, by the at least one delay circuit, an output signal using an input signal, wherein the output signal is a delayed version of the input signal;
performing, by the calibration circuit, a first phase-detection operation using the input signal and the output signal;
determining, by the calibration circuit using a result of the first phase-detection operation, a first control code for the at least one delay line circuit;
determining, by the calibration circuit using the result of the first phase-detection operation, a second control code for the oscillator circuit included in the calibration circuit; and
performing, by the calibration circuit in response to completing the initial calibration, a background calibration of the at least one delay line circuit using the at least one oscillator signal.

8. The method of claim 7, further comprising adjusting a delay value of a given variable-delay circuit of the plurality of variable-delay circuits using the first control code.

9. The method of claim 7, wherein determining the second control code includes:
generating, by a different delay-line circuit, a global output signal using a global input signal, wherein the output signal is a delayed version of the input signal;
performing, by the calibration circuit, a second phase-detection operation using the global input signal and the global output signal; and
determining, by the calibration circuit using a result of the second phase-detection operation, the second control code.

10. The method of claim 7, wherein performing the background calibration includes:

performing, by the calibration circuit, a frequency detection operation on an oscillator signal generated by the oscillator circuit;

determining, by the calibration circuit using a result of the frequency detection operation, a first offset code and a second offset code;

combining, by the calibration circuit, the first offset code with the first control code to generate a first combined code;

combining, by the calibration circuit, the second offset code with the second control code to generate a second combined code; and adjusting a first variable-delay circuit in the at least one delay line circuit and a second variable-delay circuit in the oscillator circuit using the first combined code and the second combined code, respectively.

11. The method of claim 10, wherein performing the frequency detection operation includes:

generating, by a frequency-divider circuit, a reduced-frequency signal using the oscillator signal; and determining, by a frequency-counter circuit, a frequency of the reduced-frequency signal.

12. The method of claim 7, further comprising performing, by the calibration circuit, the background calibration at periodic intervals.

13. The method of claim 7, wherein a periodicity of performing the background calibration is based on operation conditions of the calibration circuit.

14. An apparatus, comprising:

a first device coupled to a communication bus, wherein the first device is configured to transmit a first clock signal and data via the communication bus; and a second device coupled to the communication bus, wherein the second device includes a receiver circuit that includes:

a first delay-line circuit that includes a plurality of variable-delay circuits, wherein the first delay-line circuit is configured to generate a delayed version of the first clock signal, and an oscillator circuit that includes a particular variable-delay circuit that is a replica of a given variable-delay circuit of the plurality of variable-delay circuits, wherein the oscillator circuit is configured to generate an oscillator signal; and wherein the second device is configured to:

perform, as part of an initial calibration of the first delay-line circuit, a first phase-detection operation using the first clock signal and the delayed version of the first clock signal;

determine, as part of the initial calibration of the first delay-line circuit, a first control code using a first result of the first phase-detection operation;

determine, as part of the initial calibration of the first delay-line circuit, a second control code using the first result of the first phase-detection operation;

perform, using the oscillator signal, a background calibration of the first delay-line circuit in response to a determination that the initial calibration has completed; and receive the data, via the communication bus, using the delayed version of the first clock signal.

15. The apparatus of claim 14, wherein the second device is further configured to:

adjust a first delay value of at least one variable-delay circuit of the plurality of variable-delay circuits using the first control code; and adjust a second delay value of the particular variable-delay circuit using the second control code.

16. The apparatus of claim 14, wherein the first device is further configured to transmit a global clock signal via the communication bus, wherein the second device further includes a second delay-line circuit configured to generate a delayed global clock signal, wherein the delayed global clock signal is a delayed version of the global clock signal, and wherein to determine the second control code, the second device is further configured to:

perform a second phase-detection operation using the global clock signal and the delayed global clock signal; and determine the second control code using a second result of the second phase-detection operation.

17. The apparatus of claim 14, wherein to perform the background calibration, the second device is further configured to:

perform a frequency detection operation on the oscillator signal;

determine, using a result of the frequency detection operation, a first offset code and a second offset code;

combine the first offset code with the first control code to generate a first combined code;

combine the second offset code with the second control code to generate a second combined code;

adjust a first delay value of at least one variable-delay circuit of the plurality of variable-delay circuits using the first combined code; and adjust a second delay value of the particular variable-delay circuit using the second control code.

18. The apparatus of claim 17, wherein to perform the frequency detection operation, the second device is further configured to:

generate a reduced-frequency signal using the oscillator signal, wherein a first frequency of the reduced-frequency signal is less than a second frequency of the oscillator signal; and determine a frequency of the reduced-frequency signal.

19. The apparatus of claim 14, wherein the second device is further configured to perform the background calibration at regular time intervals.

20. The apparatus of claim 14, wherein the second device is further configured to perform the background calibration based on operation conditions of the second device.

* * * * *